United States Patent [19]
Acker

[11] 3,979,684
[45] Sept. 7, 1976

[54] FEEDBACK FILTER SYSTEM
[76] Inventor: William F. Acker, 14241 82nd Ave. N., Seminole, Fla. 33542
[22] Filed: June 24, 1975
[21] Appl. No.: 589,980

[52] U.S. Cl.............................. 328/167; 333/70 R
[51] Int. Cl.² ......................................... H03H 7/10
[58] Field of Search.................... 328/167; 333/70 R

[56] References Cited
UNITED STATES PATENTS

| | | | |
|---|---|---|---|
| 3,355,668 | 11/1967 | Boensel et al. ...................... | 328/167 |
| 3,659,212 | 4/1972 | Saliga................................... | 328/167 |
| 3,835,399 | 9/1974 | Holmes................................ | 328/167 |

Primary Examiner—John S. Heyman

[57] ABSTRACT

A bandpass or band reject filter system is provided for operating on frequencies in an input signal with the filter system containing a feedback loop. Quadrature components of the frequencies of interest occurring in the output signal are acted on in the feedback loop to provide a feedback signal, which can be used directly itself, to be summed with the input signal thereby effecting a cancellation of the frequencies of interest therein. The frequencies of interest can be chosen by manual tuning, or by a self-tuning system which can be provided by the addition of a further feedback arrangement.

19 Claims, 10 Drawing Figures

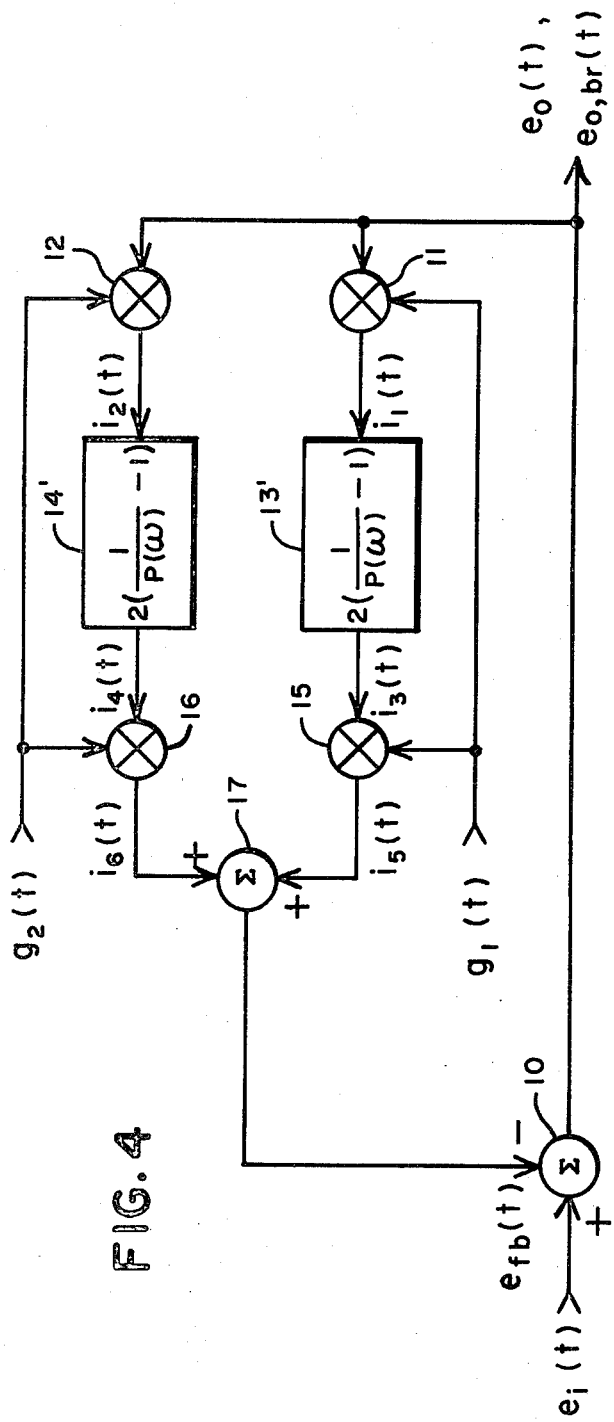
FIG. 4
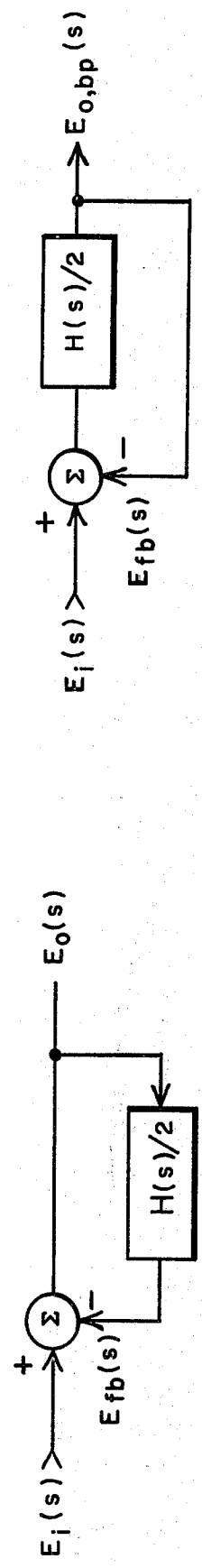
FIG. 6
FIG. 3

FEEDBACK FILTER SYSTEM

The invention herein described was made in the course of or under a contract, or subcontract thereunder, with the Department of the Air Force.

BACKGROUND OF THE INVENTION

The present invention relates to bandpass and band reject filter systems using a feedback loop particularly ones synthesizing a cancelling signal.

Often, analog signals are transmitted having a beacon frequency, i.e. a frequency tone, contained within them which is used as a frequency reference for one or another purposes. Once this purpose is satisfied, it is often necessary or desirable to remove this beacon frequency from the analog signal before further processing of this signal.

Removal of this tone requires a narrow band rejection filter, i.e. a notch filter. For a practical notch filter, it is impossible to remove a tone frequency without distorting the remaining frequencies in the analog signal. The narrower the frequency notch, i.e. frequency rejection band, of a notch filter, the smaller the distortion will be of the remaining frequencies in the analog signal. Passive notch filters have a minimum rejection bandwidth for a given attenuation requirement at the notch frequency.

Among passive notch filters, crystal notch filters will provide the smallest rejection bandwidth for a given amount of attenuation at the frequency. However, the rejection bandwidth of even an ideal crystal notch filter can be too wide to meet the bistortion requirements needed to preserve the remaining frequencies in the analog signal from which the tone is to be removed. An increase in the rejection bandwidth beyond that required by an ideal crystal notch filter comes about due to some inevitable mistuning of the crystal notch filter and to temperature and component aging changes causing a drift in the filter notch frequency. Finally, the frequency of the tone to be cancelled also often drifts and the rejection bandwidth of a crystal notch filter must be wide enough to encompass the frequency of the tone to be cancelled despite its drift since the notch frequency of a crystal notch filter is not tunable.

As is well known, band rejection filters are used in the electronics arts beyond the instance discussed in the foregoing to remove wider bands of frequencies in analog signals for various reasons. This is also true of bandpass filters which are used to pass therethrough only a selected narrow or wide band of frequencies in an analog signal as may be required in a particular application. Precise filters capable of performing these filtering functions around a central frequency of a substantial magnitude are quite desirable.

SUMMARY OF THE INVENTION

A feedback loop filtering system is disclosed which is capable of providing either a band rejection characteristic or a bandpass characteristic or both. Either the band rejection characteristic or the bandpass characteristic can be made very narrow to serve as an excellent notch filter or as an excellent narrow bandpass filter or both. When a tone of interest in the analog signal is sufficiently strong compared to other frequencies present in the analog signal, a phase-locked loop may be added to the feedback loop filter so that the rejection band or the passband of the feedback loop filter will track the strong tone in frequency. Also, for a less strong tone the phase-locked loop may be "trained" to lock the filter on that tone.

BRIEF DESCRIPTION OF THE DRAWINGS

FIG. 3 shows a baseband system diagram related to and leading to a further aspect of the invenion of FIG. 2A, FIG. 4 shows a further aspect of the invention shown in FIG. 2A corresponding to the diagram of FIG. 3, FIG. 6 shows a baseband signal diagram of a further aspect of the invention shown in FIG. 2A, FIG. 7 a further aspect of the invention shown in FIG. 2A corresponding to the diagram of FIG. 6.

DESCRIPTION OF THE PREFERRED EMBODIMENTS

Figure 1:
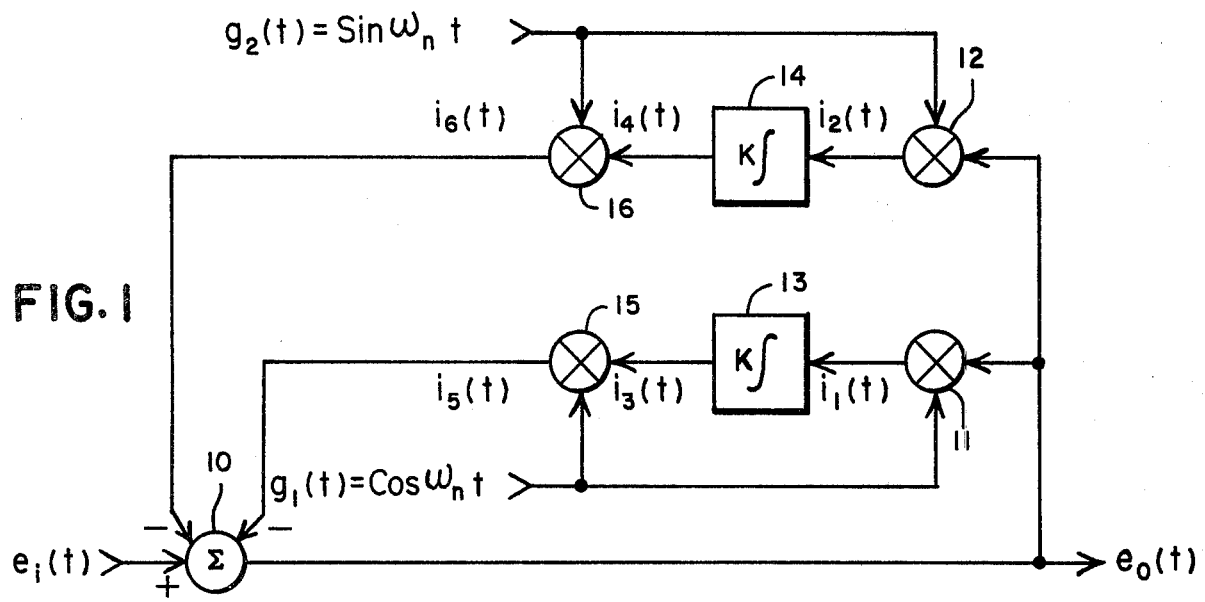
FIG. 1 shows a first embodiment of the invention which has both band rejection characteristics and a bandpass characteristic.

FIG. 1 shows a tunable, band rejection filter which rejects a band of frequencies narrow enough to serve as an excellent notch filter to remove a tone frequency in an analog input signal, $e_i(t)$. The signal $e_i(t)$ is applied to an input summing means, 10. Also combined in summing means 10 with $e_i(t)$ are two tone cancellation signals, $i_5(t)$ and $i_6(t)$ are just those signals that, when combined, will remove the tone frequency from input signal $e_i$.

Combining $e_i$ with the tone cancellation signals $i_5(t)$ and $i_6(t)$ results in the output signal, $e_o(t)$. Whatever portion of the tone to be cancelled in $e_i(t)$ still remains after the signals $i_5(t)$ and $i_6(t)$ are subtracted from $e_i(t)$ constitutes an error signal. The output signal $e_o$, including any error components therein, is applied to two demodulators, 11 and 12. These are doubly balanced modulators which translate the output signal $e_o(t)$ along the Fourier frequency axis by an amount equal to the frequency of two translating signals $g_1(t)$ and $g_2(t)$, supplied to demodulators 11 and 12, that is the frequency $\omega_n = 2\pi f_n$. These translating signals will provide a scaled amplitude replica of $e_o(t)$ about zero frequency as it occurs about $f_n$ in $e_o(t)$, i.e. the spectrum of $e_o(t)$ will be shifted such that $f_n$ in $e_o(t)$ will be zero after the shift. The results of this demodulation of the output signal $e_o(t)$ by the translating signals $g_1(t)$ and $g_2(t)$ are the intermediate signals $i_1(t)$ and $i_2(t)$.

Signals $i_1(t)$ and $i_2(t)$ as can be seen from FIG. 1, are applied to two integrators, 13 and 14, respectively. These integrators serve as i) extremely narrow bandwidth, lowpass filters which filter away nearly all the frequency content of the signals $i_1(t)$ and $i_2(t)$ except the zero frequency component, and II) memories for any zero frequency components occurring which strongly accentuate the presence of any zero frequency components occurring in signals $i_1(t)$ and $i_2(t)$ to cause them to be driven to zero via the feedback loop. Because of the translation in frequency due to demodulators 11 and 12, the zero frequency components of signals $i_1(t)$ and $i_2(t)$ which the integrators remember and accentuate are, as indicated above, just scaled values of the component which occurred at $f_n$ in the output signal $e_o(t)$. The output from the intergrators 13 and 14 are two further intermediate signals, $i_3(t)$ and $i_4(t)$ which, as indicated, have a frequency content which is little more than components at zero frequency.

Two further modulators, 15 and 16, translate signals $i_3(t)$ and $i_4(t)$ along the Fourier frequency axis such that the zero frequency components of $i_3(t)$ and $i_4(t)$ are again placed at the frequency $f_n$. This result comes about because the frequency translating signals $g_1(t)$ and $g_2(t)$ are applied to modulators 15 and 16, respectively, as well as to demodulators 11 and 12, respectively. The result from modulators 15 and 16 are the intermediate signals $i_5(t)$ and $i_6(t)$ which are signals that are essentially sinusoids of the frequency $f_n$ because signals $i_3(t)$ and $i_4(t)$ have essentially only zero frequency components to be translated. Signals $i_5(t)$ and $i_6(t)$ have amplitudes and phases which are related to the components in $e_o(t)$ at frequency $f_n$. Since signals $i_5(t)$ and $i_6(t)$ are in quadrature with one another, they contain enough information between them to synthesize a sinusoidal signal at frequency $f_n$ of any particular amplitude and phase. This amplitude and phase, because of the relation of the amplitudes and phases of $i_5(t)$ and $i_6(t)$ to the $f_n$ component in $e_o(t)$, is due to the feedback loop action just that required to cancel the $f_n$ component in $e_i(t)$.

As indicated, the tone frequency that is cancelled in $e_i(t)$ occurs at the frequency $f_n$ which is the frequency selected by the choice of frequency for translating signals $g_1(t)$ and $g_2(t)$. Thus, translating signals $g_1(t)$ and $g_2(t)$ may be called tone selection signals as they operate to select the tone which will be cancelled by the system of FIG. 1.

Figure 2A:
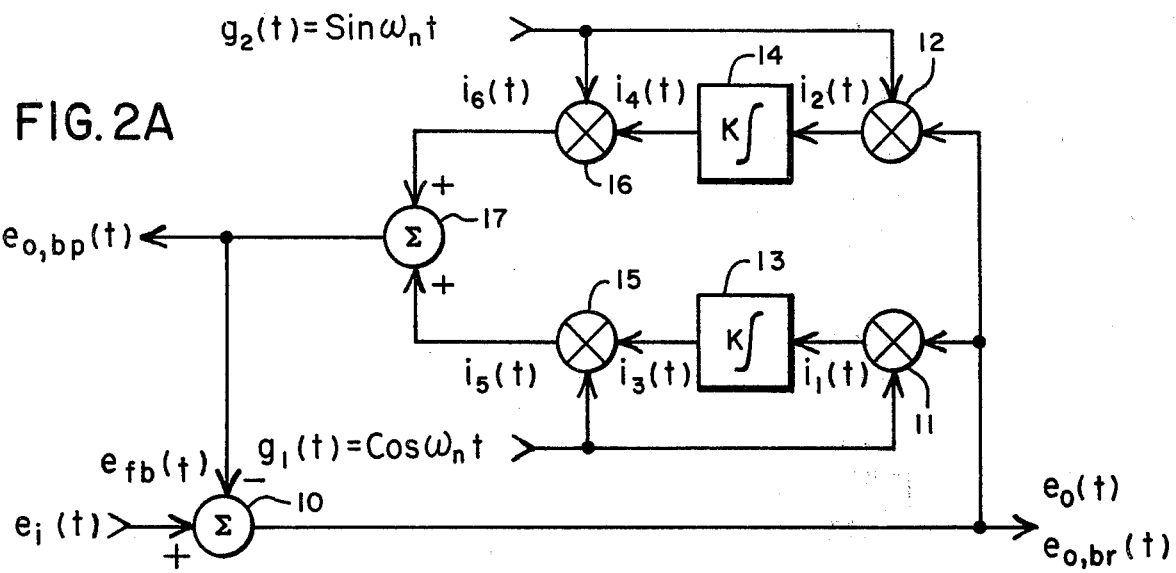
FIGS. 2A and 2B show another embodiment of the invention of FIG. 1 and magnitude versus frequency diagrams.

FIG. 2A is another version of the system of FIG. 1 wherein the intermediate signals $i_5(t)$ and $i_6(t)$ are combined first in a summing means 17 prior to being provided to summing means 10. This does not essentially alter the operation of the system in FIG. 1 but it does provide specifically in the system the signal synthesized by intermediate signals $i_5(t)$ and $i_6(t)$ which is to match the tone frequency in input signals $e_i(t)$ for the cancellation of that tone. This signal is designated $e_{fb}$ in FIG. 2A.

An analysis of the operation of FIG. 2A brings out more clearly that operation and also indicates that the system has a narrow bandpass filter capability as well as a narrow band rejection capability, i.e. a notch filter capability. The input signal $e_i(t)$ is assumed to have an arbitrary frequency content where any of the frequency components in that content can be represented as follows:

$$e_i(t) = r \cos (\omega t + \theta)$$

By varying $\omega = 2\pi f$, the amplitude $r$ and the phase $\theta$, any frequency component in the signal $e_i(t)$ can be matched. The output signal $e_o(t)$ will have a frequency content related to that in the signal $e_i(t)$ any frequency component at frequency $\omega$ in $e_o(t)$, related to a frequency component in $e_i(t)$ at the same frequency, can be represented by the following equation:

$$e_o(t) = r' \cos (\omega t + \phi).$$

Here, $e_o$ is the same frequency as that of the related component in $e_i(t)$ but the amplitude $r'$ and the phase $\phi$ can differ from that of the input frequency component in the first equation above.

As can be seen from FIG. 2A, this output signal is applied to the demodulators 11 and 12. Taking the upper leg of the system shown in FIG. 2A first, intermediate signal $i_2(t)$ is the result of multiplying the output signal $e_o$ times the tone selection signal $g_2(t)$ or:

$$i_2(t) = e_o(t) g_2(t) = r' \cos (\omega + \phi) (\sin \omega_n t)$$

Using the trigonometric identity:

$$\cos x \sin y = \tfrac{1}{2} [\sin (x+y) - \sin (x-y)]$$

The following expression results for $i_2(t)$:

$$i_2(t) = (r'/2) \{\sin [(\omega + \omega_n)t + \phi] - \sin [(\omega - \omega_n)t + \phi]\}$$

If $\omega_d$ is defined as follows:

$$\omega_d = \omega - \omega_n$$

or:

$$\omega = \omega_n + \omega_d,$$

then $i_2(t)$ can be written: $i_2(t) = r'/2 \{ \sin [(2\omega_n + \omega_d)t + \phi] - \sin [\omega_d t + \phi] \}$ As is well known, the Fourier transform for an integrator with an arbitrary gain constant K, such as integrator 14 or 15, is the following:

$$G(\omega) = (K/J\omega)$$

which can be written in a magnitude and phase representation as:

Magnitude $= K/|\omega|$
Phase $= (\pi/2)$

This phase has the effect of a time lag given as follows:

Time Lag $= (\pi/2 \, |\omega|)$

Applying the Fourier transform for the integrator given above in its magnitude and time lag representation to $i_2(t)$, alters $i_2(t)$ to provide $i_4(t)$ as follows:

$$i_4(t) = \frac{r'}{2} \left\{ \frac{K}{|2\omega_n + \omega_d|} \sin \left[(2\omega_n + \omega_d)\left(t - \frac{\pi}{2|2\omega_n + \omega_d|}\right) + \phi \right] - \frac{K}{|\omega_d|} \sin \left[\omega_d \left(t - \frac{\pi}{2|\omega_d|}\right) + \phi\right] \right\}$$

Assuming that only frequencies relatively near the tone frequency desired to be cancelled are of interest in the frequency content of the input signal $e_i(t)$, the result is that $2\omega_n$ is much greater than $\omega_d$. Then the first term of the preceding equation can be neglected in comparison to the second term. This yields:

$$i_4(t) = \frac{r'K}{2|\omega_d|} \sin \left[\omega_d t - \frac{\omega_d}{|\omega_d|} \frac{\pi}{2} + \phi \right]$$

$$= \frac{r'K}{2|\omega_d|} \sin \left[\omega_d t + \phi - \frac{\pi}{2} \text{sign}(\omega_d)\right]$$

The intermediate signal $i_4(t)$ is then multiplied in modulator 16 by the signal $g_2(t)$ to provide intermediate signal $i_6(t)$:

$$i_6(t) = g_2(t)i_4(t) = \frac{r'K}{4|\omega_d|}\left\{-\cos\left[(\omega_n + \omega_d)t + \phi - \frac{\pi}{2}\text{sign}(\omega_d)\right]\right.$$

$$\left. +\cos\left[(\omega_n - \omega_d)t - \phi + \frac{\pi}{2}\text{sign}(\omega_d)\right]\right\}$$

$$= \frac{r'K}{4|\omega_d|}\left\{\cos\left[(\omega_n + \omega_d)t + \phi - \frac{\pi}{2}\text{sign}(\omega_d)\right]\right.$$

$$\left. -\cos\left[(\omega_n - \omega_d)t - \phi + \frac{\pi}{2}\text{sign}(\omega_d)\right]\right\}$$

where the following trigonometric identity has been used:

$$\sin x \sin y = \tfrac{1}{2}[-\cos(x+y) + \cos(x-y)].$$

An expression for intermediate signal $i_5(t)$ can be derived similarly. First $i_1(t)$ is obtained by:

$$i_1(t) = e_o(t)g_1(t) = r'\cos(\omega t + \phi)\cos(\omega_n t)$$

and by use of the following trigonometric identity, $$\cos x \cos y = \tfrac{1}{2}[\cos(x+y) + \cos(x-y)],$$

$i_1(t)$ can be written using the definition for $\omega_d$ above:

$$i_1(t) = \frac{r'}{2}\left\{\cos[(\omega + \omega_n)t + \phi] + \cos[(\omega - \omega_n)t + \phi]\right\}$$

$$= \frac{r'}{2}\left\{\cos[(2\omega_n + \omega_d)t + \phi] + \cos[(\omega_d t) + \phi]\right\}$$

Applying the Fourier transform for the integrator 13 as was done for the integrator 14 and then dropping the higher frequency term yields for the intermediate signal $i_3(t)$ the following:

$$i_3(t) = \frac{r'K}{2|\omega_d|}\cos\left[(\omega_d t) + \phi - \frac{\pi}{2}\text{sign}(\omega_d)\right].$$

The signal $i_5(t)$ is obtained from multiplication of the signal $i_3(t)$ by the tone selection signal $g_1(t)$ in modulator 15 yielding the following after use of the preceding trigonometric identity:

$$i_5(t) = g_1(t)i_3(t) = \frac{r'K}{4|\omega_d|}\left\{\cos\left[(\omega_n + \omega_d)t + \phi - \frac{\pi}{2}\text{sign}(\omega_d)\right]\right.$$

$$\left. +\cos\left[(\omega_n - \omega_d)t - \phi + \frac{\pi}{2}\text{sign}(\omega_d)\right]\right\}$$

FIG. 2A shows that the signals $i_5(t)$ and $i_6(t)$ are combined by the summing means 17 which can be represented by the following equation:

$$e_{fb}(t) = i_5(t) + i_6(t).$$

Substituting the foregoing equations for $i_5(t)$ and $i_6(t)$ into the last equation yields:

$$e_{fb}(t) = \frac{K}{2|\omega_d|}r'\cos\left[(\omega_n + \omega_d)t + \phi - \frac{\pi}{2}\text{sign}(\omega_d)\right],$$

or substituting the sum $(\omega_n + \omega_d)$ from the definition for $\omega_d$, the signal $e_{fb}(t)$ can be written:

$$e_{fb}(t) = \frac{K}{2|\omega_d|}r'\cos\left[\omega t + \phi - \frac{\pi}{2}\text{sign}(\omega_d)\right]$$

This signal, $e_{fb}(t)$, is a tone cancellation signal and is related to the output signal as follows using the equation $e_o(t)$ and indicating the magnitude and the phase difference in a polar notation format:

$$e_{fb}(t) = e_o(t) \times \frac{K}{2|\omega_d|} \angle -\frac{\pi}{2}\text{sign}(\omega_d)$$

The input signal, $e_i(t)$, can be written in terms of the other signals occurring at input summing means 10 as follows:

$$e_i(t) = e_o(t) + e_{fb}(t),$$

which using the preceding equation yields:

$$e_i(t) = e_o(t)\left[1 + \frac{K}{2|\omega_d|} \angle -\frac{\pi}{2}\text{sign}(\omega_d)\right].$$

To obtain the filtering characteristic provided by the system of FIG. 2A between its output signal $e_o(t)$ and input signal $e_i(t)$, the preceding equation must be transformed into the frequency domain. This yields:

$$E_i(\omega) = E_o(\omega)\left[1 + \frac{K}{j2\omega_d}\right]$$

This can be rewritten as follows:

$$\frac{E_o(\omega)}{E_i(\omega)} = \frac{1}{1 + \frac{K}{j2\omega_d}} = \frac{j\omega_d}{j\omega_d + K/2}$$

$$= \frac{j(\omega - \omega_n)}{j(\omega - \omega_n) + K/2}$$

The result in the last equation can be recognized as the transfer function for a one pole high pass filter having its pass characteristic down 3db at $\omega = K/2$ around a zero reference frequency, i.e. if $\omega_n = 0$. When $\omega_n$ does not equal zero, this characteristic is translated along the frequency axis and appears as a band rejection filter with the band 3db points occurring at $\omega = \omega_n - K/2$ and $\omega = \omega_n + K/2$.

However, the system of FIG. 2A can also serve as a bandpass filter. This follows since the signal $e_{fb}(t)$ is supplying primarily the signals for cancelling the signals to be removed in $e_i(t)$ to thereby provide $e_o(t)$ with a notch; hence, the signal $e_{fb}(t)$ must itself appear to be a bandpass filtering result of the signal $e_i(t)$ as $e_{fb}(t)$ should not contain many frequency components but those which are to effect cancellation. This can be seen with some further analysis as follows.

The signals at the summing means 10 can also be written as follows:

$$e_{fb}(t) = e_i(t) - e_o(t) = e_i(t)\left[1 - \frac{e_o(t)}{e_i(t)}\right],$$

or:

$$\frac{e_{fb}(t)}{e_i(t)} = 1 - \frac{e_o(t)}{e_i(t)}$$

Again, to obtain the filtering action occurring between the input signal $e_i(t)$ and the feedback signal $e_{fb}(t)$, the preceding equation must be taken into the frequency domain giving:

$$\frac{E_{fb}(\omega)}{E_i(\omega)} = 1 - \frac{E_o(\omega)}{E_i(\omega)}$$

Then the preceding result for $E_o(\omega)/E_i(\omega)$ may be substituted to provide:

$$\frac{E_{fb}(\omega)}{E_i(\omega)} = 1 - \frac{j(\omega - \omega_n)}{j(\omega - \omega_n) + K/2}$$

$$= \frac{j(\omega - \omega_n) + K/2 - j(\omega - \omega_n)}{j(\omega - \omega_n) + K/2} = \frac{K/2}{j(\omega - \omega_n) + K/2}$$

This last equation can be recognized as a transfer function for a one pole lowpass filter which has its pass characteristic down 3db at $\omega = K/2$ if the tone selection frequency $\omega_n = 0$. If the tone selection frequency $\omega_n$ does not equal zero, the characteristic in the last equation is translated along the frequency axis and appears as a bandpass filter characteristic centered about $\omega_n$.

Figure 2B:
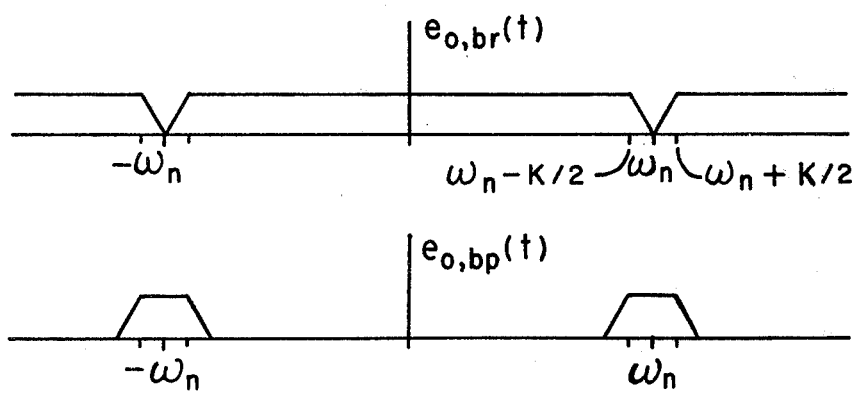

The foregoing results indicate that the signals $e_o(t)$ and $e_{fb}(t)$ might be relabelled as $e_{o,br}(t)$ and $e_{o,bp}(t)$, respectively, to indicate a band rejection filter output signal and a bandpass filter output signal. These alternative signal designations are shown in FIG. 2A. Also shown in FIG. 2B are the filter characteristics associated with these signals which show the break points in the characteristics set by the integrator gain constant K.

As indicated above, the frequency of the tone selection signals $\omega_n$ might be taken to be zero and a highpass filter output signal would result at one output and a lowpass filter output signal result at the other output. In such a situation, the tone selection demodulators and modulators would not be needed and the multiple legs of the feedback loop in the system of FIG. 2A could be consolidated. This would be a baseband system and could be represented as shown in FIG. 3 where operations therein are taken to occur in the Laplace frequency domain and, to match the system of FIG. 2A, $H(s)/2$ would be equal to $K/2s$. In the baseband system, that was $H(s)$ in FIG. 2A, i.e. the contents of blocks 13 and 14, becomes $H(s)/2$, as shown in FIG. 3, to account for having half of the signal in unwanted frequencies removed in the system of FIG. 2A which will not occur in the baseband system.

That this baseband system results in the above indicated results for $\omega_n = 0$ can be shown by the following analysis. The baseband transfer function for the output signal can be seen from FIG. 3 to be the following:

$$\frac{E_o(s)}{E_i(s)} = \frac{1}{1 + H(s)/2}.$$

Then substituting therein $H(s)/2 = K/2s$ yields:

$$\frac{E_o(s)}{E_i(s)} = \frac{1}{1 + \frac{K}{2s}} = \frac{s}{s + K/2}.$$

Placing this result in the Fourier frequency domain yields:

$$\frac{E_o(\omega)}{E_i(\omega)} = \frac{j\omega}{j\omega + K/2}$$

which is the equation of a one pole highpass filter and can be seen to be the earlier equation $$\frac{E_o(\omega)}{E_i(\omega)}$$

derived for the output of the system of FIG. 2A with $\omega_n = 0$.

Again, from FIG. 3, the transform function associated with the feedback signal is seen to be given by:

$$\frac{E_{fb}(s)}{E_i(s)} = \frac{E_o(s)}{E_i(s)} \cdot \frac{H(s)}{2}.$$

Substituting in this equation for the factors on the right hand side thereof from the preceding equation in the $s$ domain and substituting $H(s)/2 = K/2s$ gives:

$$\frac{E_{fb}(s)}{E_i(s)} = \frac{s}{s + K/2} \cdot \frac{K}{2s} = \frac{K/2}{s + K/2}.$$

Placing this in the Fourier frequency domain yields:

$$\frac{E_{fb}(\omega)}{E_i(\omega)} = \frac{K/2}{j\omega + K/2}$$

which is the equation for a single pole lowpass filter. This is the same equation as the one obtained for the feedback signal function $$\frac{E_{fb}(\omega)}{E_i(\omega)}$$

in the system of FIG. 2A with $\omega_n = 0$.

Thus, the system of FIG. 2A, in effect, translates the baseband system of FIG. 3 along the Fourier frequency axis to a point centered on the frequency $$f_n = \frac{\omega_n}{2\pi},$$

the frequency of the tone selection signal. Since the choice of $H(s)/2$ is more or less arbitrary in FIG. 3, higher order band rejection and bandpass filtering characteristics can be provided by the system shown in FIG. 2A if circuits having frequency domain transfer functions $H(\omega)$ other than $K/\omega$ are substituted for the integrators shown in the system of FIG. 2A. The required transfer function for the blocks 13 and 14 in FIG. 2A, $H(\omega)$, for a specified $\frac{E_n(\omega)}{E_i(\omega)}$ or $\frac{E_{nbu}(\omega)}{E_i(\omega)}$ can be found using the baseband system of FIG. 3 with the results found there translated along the Fourier frequency axis by a system of FIG. 2A.

To determine the $H(\omega)$ function required for the circuits to replace the integrators in the system of FIG. 2A to form a higher order band rejection filter, the transfer function associated with the output signal in the baseband system of FIG. 3 must be equated with the higher order high-pass filtering characteristic that corresponds to the desired higher order bandpass filter characteristic. Taking the higher order highpass filter to be:

$$P(s) = \frac{B_N S^N}{B_o + B_1 S + B_2 S^2 + \ldots + B_N S^N}$$

the equating of this with the baseband output transfer function of the system of FIG. 3 yields:

$$\frac{E_o(s)}{E_i(s)} = \frac{1}{1 + H(s)/2} = P(s).$$

This may be solved for $H(s)$ to yield the necessary network characteristic, the result being:

$$H(s) = 2\left[\frac{1}{P(s)} - 1\right]$$

Note that if $P(s)$ equals $s/(s+K/2)$, then $H(s)/2$ equals $K/2s$ in accord with the baseband system analysis above.

FIG. 4 shows the system of FIG. 2A having the general result for $H(s)$ just found above inserted in place of the integrators of FIG. 2A. The blocks 13' and 14' shown in FIG. 4 in place of the integrator blocks 13 and 14 of FIG. 2A have the results for $H(s)$ placed in the Fourier frequency domain, yielding $H(\omega)$, to indicate its filtering function. The result is that the system of FIG. 4 exhibits a transfer function between its output and its input as follows:

$$\frac{E_o(\omega)}{E_i(\omega)} = P(\omega - \omega_n)$$

As an example, choose $P(\omega)$ to have the characteristic of a second order Butterworth filter or $$P(\omega) = \frac{(j\omega)^2}{\omega_K^2 + \sqrt{2}\,\omega_K(j\omega) + (j\omega)^2}$$

Then, $H(\omega)$ is determined as follows:

$$H(\omega) = 2\left[\frac{1}{P(\omega)} - 1\right] = 2\left[\frac{\omega_K^2 + \sqrt{2}\,\omega_K(j\omega) + (j\omega)^2}{(j\omega)^2} - \frac{(j\omega)^2}{(j\omega)^2}\right]$$

$$= 2\left[\frac{\omega_K^2}{(j\omega)^2} + \sqrt{2}\,\frac{\omega_K}{j\omega}\right] = \frac{2\omega_K}{j\omega}\left(\frac{\omega_K}{j\omega} + \sqrt{2}\right)$$

Figure 5:
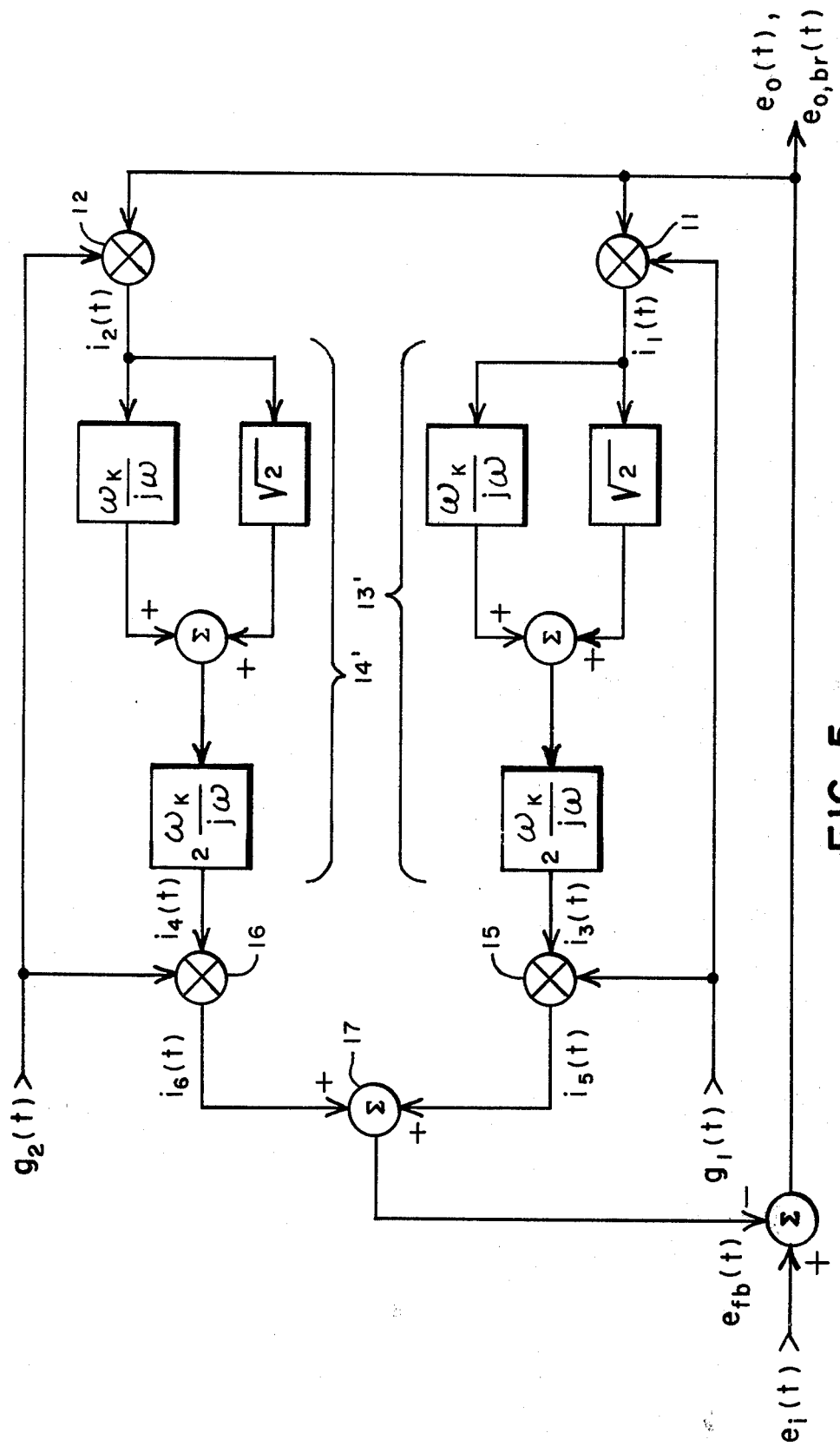
FIG. 5 shows a more specific embodiment of the system shown in FIG. 4.

The result of implementing the preceding equation is shown in FIG. 5.

To obtain a higher order bandpass filter, the transfer function associated with the feedback signal of the baseband system in FIG. 3 must be equated with the higher order lowpass filter associated with the desired higher order bandpass filter characteristic. Since what is a feedback signal in the baseband system of FIGS. 3 will now become the output signal, the baseband system of FIG. 3 is redrawn as shown in FIG. 6.

Let the arbitrary higher order lowpass filter be represented as follows:

$$Q(s) = \frac{A_o}{A_o + A_1 S + A_2 S^2 + \ldots A_N S^N}$$

This result must be equated with the baseband transfer function associated with the feedback signal of FIG. 3 or the baseband output signal of FIG. 6. As can be seen from FIG. 6 this gives:

$$\frac{E_o(s)}{E_i(s)} = \frac{E_{o,bu}(s)}{E_i(s)} = \frac{H(s)/2}{1 + H(s)/2} = Q(s)$$

This may again be solved for $H(s)$ giving:

$$H(s) = \frac{2Q(s)}{1 - Q(s)}$$

Figure 7:
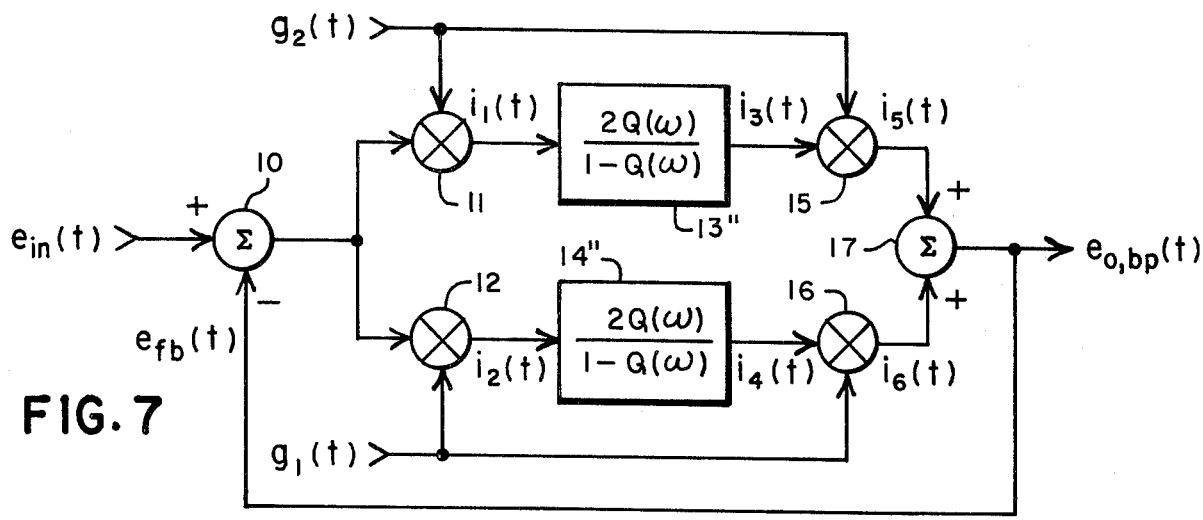

FIG. 7 shows implementing the preceding results in the system of FIG. 2A with the general result for $H(s)$ just found above inserted in place of the integrator of FIG. 2A. The blocks 13'' and 14'' shown in FIG. 7 replace the block 13 and 14 in FIG. 2A. The $H(s)$ function has been again placed in the Fourier frequency domain to indicate its filtering function giving $H(\omega)$. The result of translating the baseband result can then be written as follows:

$$\frac{E_o(\omega)}{E_i(\omega)} = \frac{E_{o,bu}(\omega)}{E_i(\omega)} = Q(\omega - \omega_n)$$

representing the bandpass filtering characteristic occurring between the input of the system of FIG. 7 and the output thereof.

The foregoing shows that a band rejection filter or a bandpass filter of arbitrary order can be constructed using the feedback loop system shown in FIG. 2A. Also to be noted, the filter is tunable as to which band of frequencies is to be rejected or passed by merely changing the frequency of the tone selection signals $g_1(t)$ and $g_2(t)$. The use of feedback, i.e. a closed loop system, with some memory or integration occurring in the loop is especially advantageous in that errors are reduced to zero or to within the sensitivity of the system to detect errors. Any phase or gain offsets occurring within the loop are diminished by the overall loop gain. As stated, only offsets in the demodulators or at the integrators which appear as error signals have any effect on the performance of the filter system. The bandwidth of the filter can be made extremely narrow when a notch filter is desired to reduce the distortion introduced by the filter to a negligible amount. In other words, that bandwidth, which is also the bandwidth of the tone cancelling signal or feedback signal, can be very close to just that required to cancel the tone. The bandwidth for the system of FIG. 2B as has been indicated in the equations and in the frequency diagrams of FIG. 2A, is determined by the integrator constant K.

While the filter described to this point has been shown to be tunable, it is not self tuning with respect to locking onto a certain tone frequency in the input signal. For instance, when the filter is to act as a notch filter to remove a particular tone frequency, it would be very desirable to have the filter notch frequency track the tone to be removed. If the tone frequency to be removed is a relatively strong tone compared to the frequencies around it in the input signal, a self-tuning filter can be made by use of a phaselocked loop with the filter system of FIG. 2A. The phase-locked loop will lock onto the stronger tone frequency and can keep the feedback filter tuned to just this tone frequency for its cancellation, i.e. a notch filter results having its center or notch frequency tuned to the desired tone frequency for cancellation.

Figure 8:
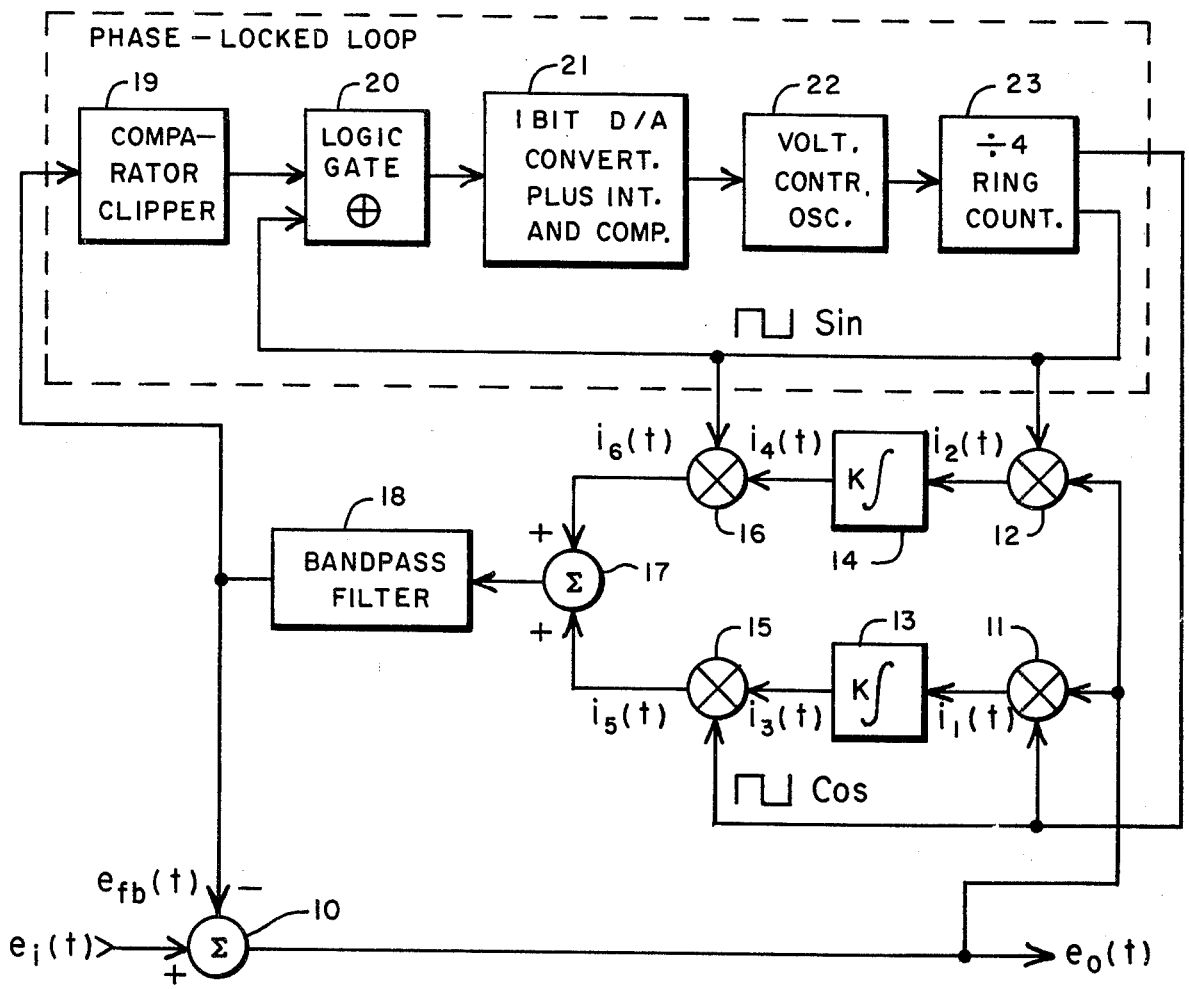
FIG. 8 shows a further aspect of the invention shown in FIG. 2A.

FIG. 8 shows a system of FIG. 2A having a phase-locked loop added thereto to serve as a self tuning notch filter for removing a desired frequency tone from the input signal $e_i(t)$. Of course, the system also serves as a tuned narrow bandpass filter should the output be taken from the feedback signal $e_{fb}(t)$.

The phase-locked loop can be of a conventional kind and has been chosen here to be in some parts digitized. The input signal to the phase-locked loop is the feedback signal $e_{fb}(t)$ which is amplified substantially and then clipped by comparator clipper 19 so that the signal to the phase-locked loop is essentially a square wave having a constant amplitude and so carrying only frequency and phase information. Thus, use of a square wave of a fixed amplitude provides gain controlled input to the remainder of the phaselocked loop and switching to a digital system-like wave form in convenient for this reason rather than continuing to perform analog operations on the feedback signal.

The output of the voltage control oscillator, 22, also has logic wave forms since it is relatively easy to provide the required phases between the tone selection signals. This being the case, it is also convenient to use logic controlled analog gates to form switching modulators and demodulators for the balanced demodulators 11 and 12 and the balanced modulators 15 and 16. Use of such switching modulators for frequency translators 15 and 16 require that the harmonics that result from this sort of modulation be filtered away and therefore a filter, 18, is provided after summing means 17.

As filter 18 is only needed to remove harmonics, a lowpass filter might be thought sufficient. However, such a lowpass filter may introduce too much phase lag in the feedback filter loop which can effect the stability of the system shown in FIG. 8. Therefore, a bandpass filter is used centered around the expected frequency of the tone to be cancelled to minimize the phase lag as a bandpass filter can be designed to have a zero phase shift at the center of its passband.

The output signal from comparator clipper 19 is supplied to an EXCLUSIVE OR logic gate, 20, which also receives a signal having one of the relative phases from the output of the phase-locked loop. If the two inputs have just a 90° phase difference, the output of logic gate 20 will have a 50% duty cycle, but if the phase relationship of the input is more or less than 90°, then the output of logic gate 20 will have a duty cycle more or less than 50%. A duty cycle of other than 50% indicates a phase error, i.e. a phase other than 90°, between these signals.

The logic gate signal is supplied to a one bit digital to analog converter, 21, which converts the information in the logic gate 20 output signal to an analog signal which is indicative of the phase relationship between the comparator clipper 19 signal and the phase signal from the output of phase-locked loop. The converted signal is also integrated. Lead network compensation is applied to this signal in place of integration at higher frequencies to prevent instability occurring in the loop at these frequencies.

Suitable one bit digital to analog convertors can be found in co-pending application Ser. No. 589,954 made by the present applicant and assigned to the same assignee as the present application. Using the converters in that application here, the D type flip-flop would be replaced by unclocked logic buffers.

The output of the compensating and integrating one bit digital to analog converter 21 is then applied to a voltage control oscillator. The free running frequency of the voltage control oscillator is set by a crystal and is set very close to four times the tone frequency desired to be cancelled to enable the phase-locked loop to more easily lock onto the desired tone frequency. The output of the voltage control oscillator is provided as a square wave. This square wave is divided down by four to thereby provide the various phases necessary for the tone cancellation signals. The divider, 23, is conveniently a ring counter.

The phase-locked loop must respond slowly to changes in the signal $e_{fb}(t)$ supplied thereto--there must be substantial delay in the phase-locked loop response if stability for the entire system of FIG. 8 is to be maintained. This delay must be long enough in the phase-locked loop to permit the feedback filter to settle out before the phase-locked loop acts on changes in $e_{fb}(t)$. In other words, the phase lag in the transfer function device for the feedback signal with respect to the system of FIG. 2A must be sufficiently small with respect to the phase lag in the phase-locked loop for stable operation to result.

This essentially means that the phase-locked loop bandwidth must be narrower than the bandwidth of the feedback loop filter which, as set out above, is determined by the gain constant of integrators 13 and 14. However, it is quite desirable to have the bandwidth of the phase-locked loop relatively wide during initial operation, i.e. the acquisition stage, when the phase-locked loop is trying to acquire the tone frequency signal to lock thereon. Further, the bandwidth of the feedback filter should be as narrow as possible for good tone frequency cancelling performance if distortion is to be minimized.

Thus, these conflicting requirements may make it necessary to increase the bandwidth of the phase-locked loop initially to allow it to acquire the tone frequency on which it is to lock. Then for stability, the bandwidth of the feedback filter must also be widened initially during the "training" of the phase-locked loop. Thereafter, the bandwidth of both may be narrowed.

The need for training the phase-locked loop increases as the amplitude of the tone frequency to be cancelled diminishes with respect to other frequencies therearound included in the input signal $e_1(t)$. Also, the difficulty of acquisition depends on how close the free running frequency of the phase-locked loop comes to the tone frequency desired to be cancelled.

However, once the phase-locked loop has locked onto the tone frequency desired to be cancelled, the system of FIG. 8 becomes an automatic, self-tuning notch filter provided that changes in the tone frequency desired to be cancelled are not so abrupt as to cause the phase-locked loop to lose lock on that tone frequency. The use of an in-phase and a quadrature phase channel make it unnecessary for the phase-locked loop to lock onto the tone frequency desired to be cancelled at any specific phase angle. Thus it is unnecessary to hold close tolerances or perform any calibrations when manufacturing the system of FIG. 8 and the system can operate automatically without requiring any initial external adjustment, although the system may have programmed therein an initial training period.

To obtain a satisfactory manually tuned filter, one could eliminate blocks 19 through 21 in FIG. 8 and the supplying of the feedback signal thereto. The manually varying of the voltage to the input to the voltage controlled oscillator would allow tuning the filter as desired.

Figure 9:
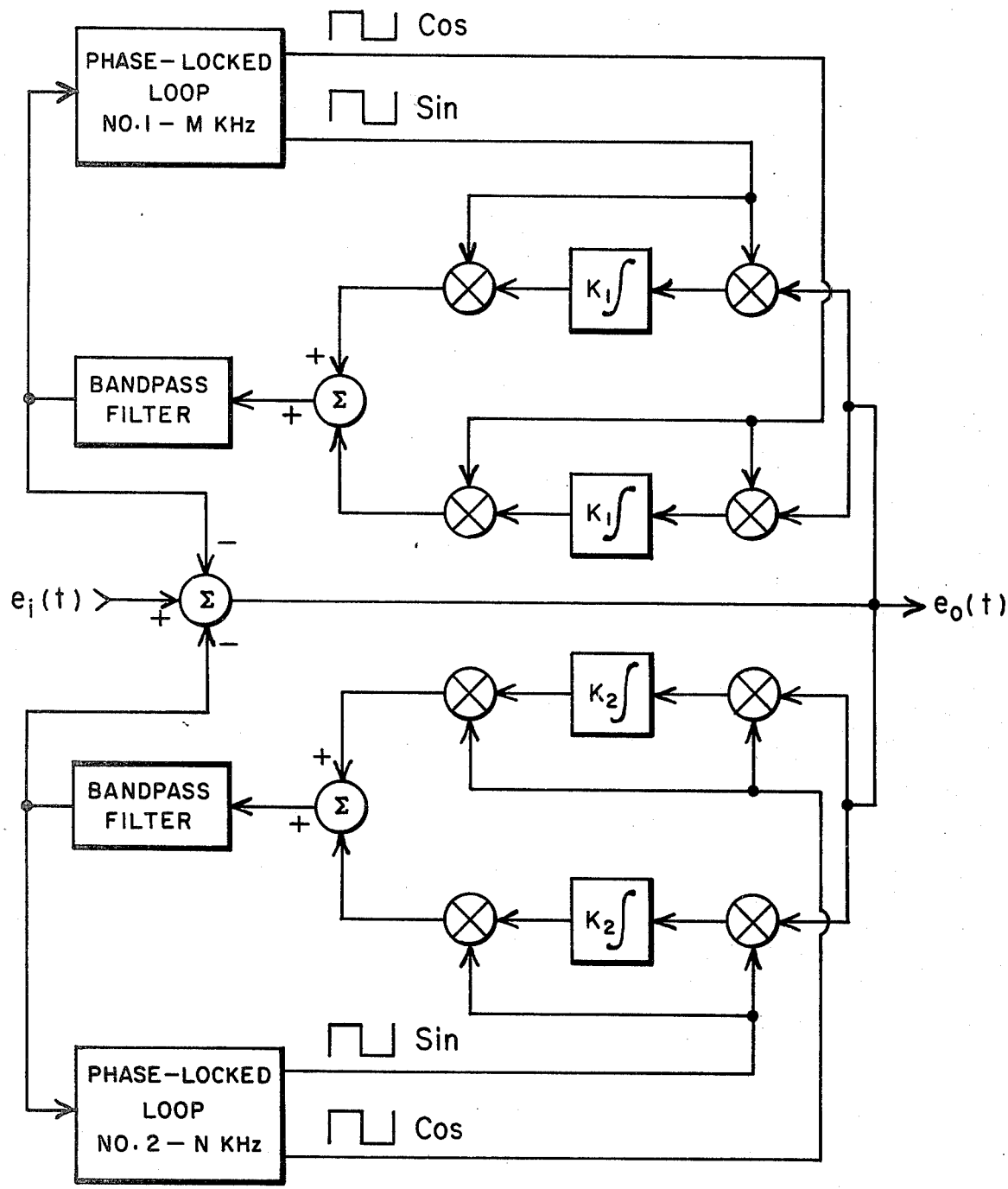
FIG. 9 shows a further aspect of the invention shown in FIG. 8.

The use of filter systems such as shown in the figures discussed so far in series, one after another, to remove a number of tone frequencies from an analog signal is, of course, quite possible. However, the filter systems shown in the foregoing figures can also be used in parallel to reduce the number of summing amplifiers required as is shown in FIG. 9.

The embodiments of the invention in which an exclusive property or right is claimed are defined as follows:

1. A feedback filtering system for filtering frequencies in an input signal, said filtering system comprising:
    a first summing means to receive said input signal and to receive a first cancellation signal, said summing means being capable of combining said input signal and said first cancellation signal to form a first combined signal serving as a first filter signal;
    a first translating means to receive said first filter signal, said first translating means being capable of translating said first filter signal in frequency by effective multiplication of said first filter signal with a periodic first tone selection signal to thereby provide a first intermediate signal;
    a second translating means to also receive said first filter signal, said second translating means being capable of translating said first filter signal in frequency by effective multiplication of said first filter signal with a periodic second tone selection signal to thereby provide a second intermediate signal;
    a third translating means to receive a third intermediate signal obtained from said first intermediate signal, said third translating means for translating said third intermediate signal in frequency by effective multiplication of said third intermediate signal with a periodic third tone selection signal to thereby provide a fifth intermediate signal, and
    a fourth translating means to receive a fourth intermediate signal obtained from said second intermediate signal, said fourth translating means for translating said fourth intermediate signal in frequency by effective multiplication of said fourth intermediate signal with a periodic fourth tone selection signal to thereby provide a sixth intermediate signal, said first cancellation signal being obtained from said sixth intermediate signal.

2. The apparatus of claim 1 wherein said first summing means receives a second cancellation signal also combined therein with said input signal and with said first cancellation signal, said second cancellation signal being substantially equal to said fifth intermediate signal and said first cancellation signal being substantially equal to said sixth intermediate signal.

3. The apparatus of claim 1 wherein a second summing means is provided to receive both said fifth intermediate signal and said sixth intermediate signal, said second summing means being capable of combining said fifth and sixth intermediate signals to form a second combined signal from which said first cancellation signal is obtained.

4. The apparatus of claim 1 wherein said first tone selection signal is substantially equal to said third tone selection signal and said second tone selection signal is substantially equal to said fourth tone selection signal.

5. The apparatus of claim 1 wherein said first tone selection signal has a period substantially equal to that of said second tone selection signal but has a phase difference relative thereto; and, said third tone selection signal has a period substantially equal to said fourth tone selection signal but has a phase difference relative thereto.

6. The apparatus of claim 1 wherein a first signal processing means is provided to receive said first intermediate signal and provides at an output thereof said third intermediate signal; and, a second signal processing means is provided to receive a said second intermediate signal and provides at an output thereof said fourth intermediate signal.

7. The apparatus of claim 1 wherein said first tone selection signal is provided by a voltage controlled oscillator.

8. The apparatus of claim 1 wherein said first tone selection signal is provided by a phase-locked loop.

9. The apparatus of claim 6 whereiin said first signal processing means is an integrator and said second signal processing means is an integrator.

10. The apparatus of claim 6 wherein said first tone selection signal has a first period substantially equal to that of said second tone selection signal but has a phase difference relative thereto; and, said third tone selection signal has a second period substantially equal to that of said fourth tone selection signal but has a phase difference relative thereof.

11. The apparatus of claim 10 wherein said first tone selection signal is substantially equal to said third tone selection signal and said second tone selection signal is substantially equal to said fourth tone selection signal.

12. The apparatus of claim 11 wherein said first summing means receives a second cancellation signal also to be combined therein with said input signal and with said first cancellation signal, said second cancellation signal being substantially equal to said fifth intermediate signal and said first cancellation signal being substantially equal to said sixth intermediate signal.

13. The apparatus of claim 11 wherein a second summing means is provided to receive both said fifth intermediate signal and said sixth intermediate signal, said second summing means being capable of combining said fifth and sixth intermediate signals to form a second combined signal from which said first cancellation signal is obtained.

14. The apparatus of claim 11 wherein said first signal processing means is an integrator and said second signal processing means is an integrator.

15. The apparatus of claim 13 wherein a bandpass filter means receives said second combined signal, said bandpass filtering means filtering said second combined signal to provide said first cancellation signal.

16. The apparatus of claim 13 wherein a lowpass filter means receives said second combined signal, said lowpass filtering means filtering said second combined signal to provide said first cancellation signal.

17. The apparatus of claim 13 wherein a phase-locked loop also receives said first cancellation signal, said phase-locked loop providing said first tone selection signal and said second tone selection signal.

18. The apparatus of claim 17 wherein said first translating means, said second translating means, said third translating means and said fourth translatingg means are each a doubly balanced switching modulator.

19. The system of claim 14 wherein said phase-locked loop has a free-running frequency with a period nearly equal to said first and second period.

* * * * *